United States Patent [19]

Nguyen

[11] Patent Number: 5,195,299

[45] Date of Patent: Mar. 23, 1993

[54] METHOD OF REDUCING MOISTURE CONTENT OF HERMETIC PACKAGES CONTAINING SEMICONDUCTOR DEVICES

[75] Inventor: My N. Nguyen, San Diego, Calif.

[73] Assignee: Johnson Matthey Inc., Valley Forge, Pa.

[21] Appl. No.: 843,735

[22] Filed: Feb. 28, 1992

[51] Int. Cl.$^5$ .................... B65B 25/00; B65B 31/02
[52] U.S. Cl. ...................... 53/428; 53/440; 53/472; 252/181.1
[58] Field of Search ............ 53/428, 431, 433, 472, 53/477, 478, 432; 204/181.1; 562/869; 252/181.1, 181.2

[56] References Cited

U.S. PATENT DOCUMENTS

| | | | |
|---|---|---|---|
| 1,743,167 | 1/1930 | Styer | 252/181.1 X |
| 2,895,270 | 7/1959 | Blaess | 53/428 X |
| 3,586,926 | 6/1971 | Nakamura et al. | 252/181.1 X |
| 4,280,885 | 7/1981 | Savery | 252/181.1 X |
| 4,375,498 | 3/1983 | Le Minez et al. | 204/181.1 X |
| 5,114,003 | 5/1992 | Jackisch et al. | 53/428 X |

Primary Examiner—Horace M. Culver
Attorney, Agent, or Firm—Christie, Parker & Hale

[57] ABSTRACT

Described is a method of reducing the moisture content in a hermetic package containing a semiconductor device by including a small amount of cyanate ester within the package.

3 Claims, 2 Drawing Sheets

METHOD OF REDUCING MOISTURE CONTENT OF HERMETIC PACKAGES CONTAINING SEMICONDUCTOR DEVICES

FIELD OF THE INVENTION

The present invention relates to a method of reducing the water moisture content in a hermetic package containing a semiconductor device to minimize the possibility of damage to the semiconductor device which may be caused by the presence of water in the package.

BACKGROUND OF THE INVENTION

Hermetic packages for semiconductor devices are typically ceramic packages sealed with caps or lids using glass or metal seals. Hermetic sealing is employed to prevent entry into the package of undesirable chemicals which could damage the semiconductor device contained therein. However, the presence of moisture, even in very small or trace amounts, within the hermetic package can also damage the semiconductor device. To avoid any damage to the semiconductor device from moisture contained within the package after hermetic sealing, it is necessary to have the moisture content less than 5000 ppm, otherwise moisture induced corrosion failure of the semiconductor device may result.

One of the sources of moisture in the package can be the inorganic adhesive used to attach the semiconductor device to a substrate. To avoid the possibility of introducing moisture to the package from the adhesive, inorganic adhesive such as silver filled glass paste have been used. These adhesives do not release moisture upon heating for curing. However, common die attach adhesive containing polymers, epoxy, polyimide, etc., give off moisture upon heating for curing and therefore cannot be used where low moisture conditions within the hermetic package are required.

The present invention provides a method of reducing the water moisture content in a hermetic package containing a semiconductor device to prevent damage to the semiconductor.

SUMMARY OF THE INVENTION

According to the present invention there is provided a method of reducing the water moisture content which comprises incorporating within the package a small but effective amount of a cyanate ester. The cyanate ester is reacted with water moisture to produce an intermediate imidocarbonic acid which becomes molecularly rearranged upon formation into a stable carbamate molecular structure. Upon exposure of the molecular carbamate structure to an elevated temperature such as would be used to cure the die attach adhesive securing the semiconductor device to the substrate, the carbamate further reacts with water to produce carbon dioxide. The presence of carbon dioxide within the hermetic package is not deleterious or damaging to the semiconductor device and corrosion of the device, as may be induced by the presence of water moisture within the package, is thereby avoided.

DETAILED DESCRIPTION OF THE INVENTION

Figure 1:
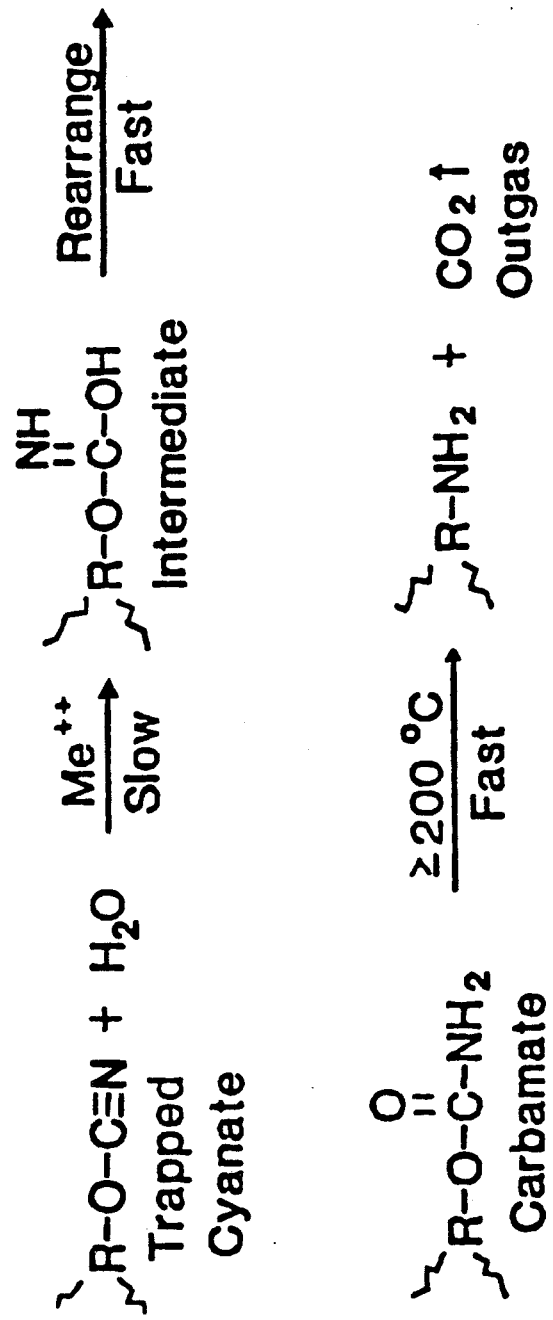
FIG. 1 is a description of the chemical reactions which the cyanate ester undergo to reduce the moisture content within a hermetic package.
Figure 2:
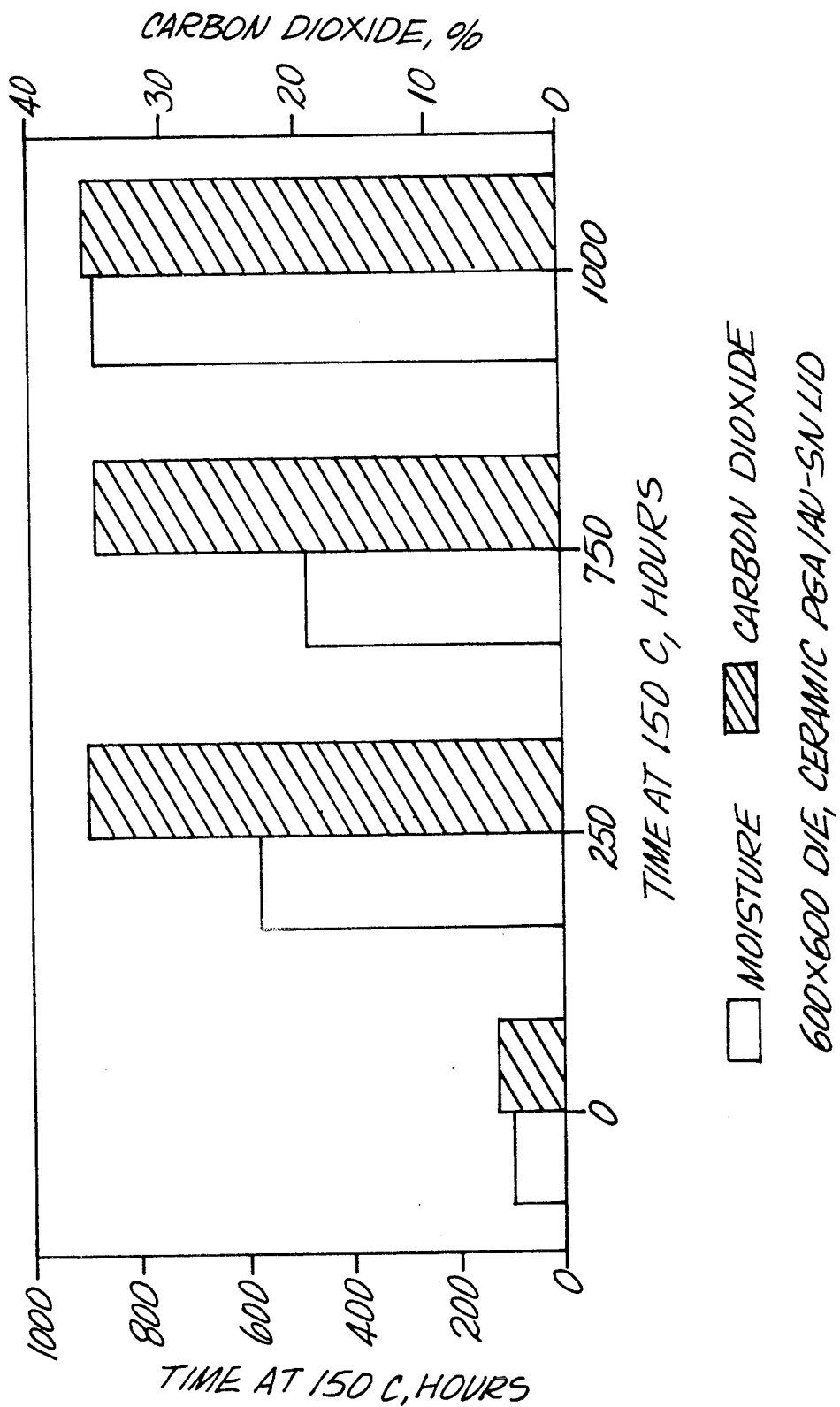
FIG. 2 is a graph showing the effects of aging at 150° C. comparing the amount of moisture and carbon dioxide which is released.

To reduce the moisture content of a hermetic package it is necessary to incorporate within the package a small but effective amount of cyanate ester. The cyanate ester undergoes the chemical reactions described in FIG. 1. As can be seen, the cyanate ester reacts with the water moisture to produce an imidocarbonic acid as an intermediate which quickly rearranges upon formation into a stable carbamate. The carbamate, upon exposure to an elevated temperature of at least 100° C. yields carbon dioxide which is not injurious to semiconductor device in the package.

The cyanate ester may be incorporated within the package in any suitable manner. One manner of incorporating cyanate ester in the package is to incorporate it in a die attach adhesive. Examples of suitable die attach adhesive compositions in which cyanate ester has been incorporated appear below in Table I.

TABLE I

| | Wt. % |
|---|---|
| A. | |
| Cyanate ester ("Arocy L10") | 97.94 |
| Cobaltous acetylacetonate | 0.01 |
| Nonylphenol | 1.95 |
| B. | |
| Cyanate ester ("Arocy L10") | 16.65 |
| Ag flake | 83.0 |
| Nonylphenol | 0.33 |
| Cobaltous Acetylacetonate | 0.02 |
| C. | |
| Cyanate ester ("Arocy L10") | 8.32 |
| REX 378 | 8.32 |
| Ag flake | 83.00 |
| Nonylphenol | 0.33 |
| Zinc napthenate | 0.03 |
| D. | |
| Cyanate ester ("Arocy 40/8.32% + M20 8.32%) | 16.64 |
| Ag flake | 83.0 |
| Nonylphenol | 0.33 |
| Cobalt acetylacetonate | 0.02 |

The moisture content in a hermetic pack in which the cyanate ester has been incorporated has been found to be extremely low. In fact, the moisture content is even lower than that of a blank cavity or of package which does not contain any adhesive or other source of moisture.

The data shown in Table II compares the moisture content for polyimide, epoxy die attach materials, a blank hermetic package, and a package in which cyanate ester has been incorporated. As can be seen, the moisture content in a package employing epoxy resin but which does not include cyanate ester within it, is 57,500 ppm. as compared to less than 100 ppm. moisture in a comparably sized ceramic package in which cyanate ester has been incorporated.

TABLE II

| Components | Cyanate Ester-Containing Compound | Blank Package | Epoxy Adhesive w/o Cyanate Ester |
|---|---|---|---|
| Nitrogen (%) | 95.2 | 99.6 | 89.4 |
| Carbon dioxide | 4.7% | 195 ppm. | <0.01% |
| Moisture (ppm) | <100 | 1915 | 57500 |
| Hydrocarbon (ppm) | 319 | NA | <100 |

TABLE II-continued

| Components | Cyanate Ester-Containing Compound | Blank Package | Epoxy Adhesive w/o Cyanate Ester |
|---|---|---|---|
| Cure profile: Lid seal temp. °C. | 10 min. at 200° C. 310 (solder seal lid plus cyanate ester) | NA | (Epoxy adhesive) |

To illustrate additional advantages of incorporating cyanate ester in a package that contains moisture, further thermal cycling tests were conducted in which the packages were thermally cycled from −65° C. to 150° C. over 1000 cycles and then stored at 150° C. for 1000 hours. The results of these tests indicate that the packages containing cyanate ester still retain low moisture content even under these tests conditions.

Two common methods of sealing hermetic packages containing semiconductor devices are to braise a lid, such as a gold plated "Kovar" lid, onto the package with a suitable gold alloy such as an Au-Sn alloy. Another method is glass sealing. In glass sealing a glass is used to form a sandwiched seal between a ceramic lid and a ceramic substrate. Generally, glass sealing is more popular because of its lower cost. However, current techniques of glass sealing require sealing temperatures well above 400° C. and are therefore not suitable for many applications because such elevated temperatures may damage some semiconductor devices.

Another method of incorporating a cyanate ester into the standard ceramic hermetic package is to apply a small amount of cyanate ester to the backside of the lid, such as either a "Kovar" lid or ceramic lid. Such a formulation may comprise a cyanate ester compound. The formulation may also include fillers, alumina and- /or silicon carbide. The package and lid is then sealed at an elevated temperature, e.g., 275° C. to 400° C. For the cyanate ester to adhere to the lid best, a small amount of alkylphenol and/or a metal curing catalyst may be added to the cyanate ester to increase adhesiveness.

It is apparent from the foregoing that by including cyanate ester within a hermetic package containing a semiconductor device, the moisture content within the package may be significantly reduced so as to avoid injury or damage to the semiconductor device contained in the package. It is also apparent that within the purview of the invention the cyanate ester may be included in various ways to achieve this function.

Accordingly, the scope of the invention should be limited only by the appended claims wherein what is claimed is:

1. A method of reducing the water moisture content in a hermetic package containing a semiconductor device comprising incorporating within said package a small but effective amount of cyanate ester, reacting said cyanate ester with water to produce an imidocarbonic acid which molecularly rearranges upon formation into a stable carbamate molecular structure, exposing said package to an elevated temperature in the range of about 100° C. to 400° C. whereby said carbamate further reacts with water to produce carbon dioxide.

2. A method according to claim wherein said cyanate ester is incorporated within the package in the form of a cyanate ester-containing adhesive formulation.

3. A method according to claim wherein said package includes a lid and said cyanate ester is incorporated within the package by applying the same to the backside of the package lid prior to sealing.

* * * * *

UNITED STATES PATENT AND TRADEMARK OFFICE
CERTIFICATE OF CORRECTION

PATENT NO. : 5,195,299

DATED : March 23, 1993

INVENTOR(S) : My N. Nguyen

It is certified that error appears in the above-identified patent and that said Letters Patent is hereby corrected as shown below:

Column 1, line 5, insert
-- Cross-Reference to Related Application
This application is related to U.S. Patent Application S.N. 07/602,504, filed October 24, 1990, now U.S. Patent No. 5,150,195, dated September 22, 1992 --.

Column 4, line 28, after "claim" insert -- 1 --.
Column 4, line 31, after "claim" insert -- 1 --.

Signed and Sealed this

Twenty-second Day of November, 1994

Attest:

BRUCE LEHMAN

Attesting Officer

Commissioner of Patents and Trademarks

REEXAMINATION CERTIFICATE (2796th)
United States Patent [19]
Nguyen

[11] B1 5,195,299
[45] Certificate Issued * Feb. 13, 1996

[54] METHOD OF REDUCING MOISTURE CONTENT OF HERMETIC PACKAGES CONTAINING SEMICONDUCTOR DEVICES

[75] Inventor: My N. Nguyen, San Diego, Calif.

[73] Assignee: Johnson Matthey Inc., Valley Forge, Pa.

Reexamination Requests:
No. 90/003,166, Aug. 18, 1993
No. 90/003,179, Aug. 31, 1993

Reexamination Certificate for:
Patent No.: 5,195,299
Issued: Mar. 23, 1993
Appl. No.: 843,735
Filed: Feb. 28, 1992

[*] Notice: The portion of the term of this patent subsequent to Sep. 22, 2009, has been disclaimed.

Certificate of Correction issued Nov. 22, 1994.

[51] Int. Cl.$^6$ ............... B65B 25/00; B65B 31/02
[52] U.S. Cl. ............... 53/428; 53/440; 53/472; 252/181.1
[58] Field of Search ............... 53/428, 440, 472, 53/431, 433, 477, 478, 432, 329.2; 204/181.1; 562/869; 252/181.1, 181.2

[56] References Cited

U.S. PATENT DOCUMENTS

| | | |
|---|---|---|
| 1,743,167 | 1/1930 | Styer . |
| 2,895,270 | 7/1959 | Blaess . |
| 3,586,926 | 6/1971 | Nakamura et al. . |
| 3,595,900 | 7/1971 | Loudas et al. . |
| 3,658,623 | 4/1972 | Grigat et al. ............... 156/331.1 |
| 4,280,885 | 7/1981 | Savery . |
| 4,369,302 | 1/1983 | Ikeguchi et al. ............... 528/119 |
| 4,375,498 | 3/1983 | Le Minez et al. . |
| 4,401,776 | 8/1983 | Munk . |
| 4,552,690 | 11/1985 | Ikeguchi et al. . |
| 4,604,452 | 8/1986 | Shimp . |
| 4,608,434 | 8/1986 | Shimp . |
| 4,699,888 | 10/1987 | Dumesnil et al. . |
| 4,709,008 | 11/1987 | Shimp . |
| 4,732,702 | 3/1988 | Yamazaki et al. . |
| 4,740,343 | 4/1988 | Gaku et al. ............... 524/439 |
| 4,740,584 | 4/1988 | Shimp . |
| 4,740,830 | 4/1988 | Ketley . |
| 4,785,075 | 11/1988 | Shimp . |
| 4,831,086 | 5/1989 | Das et al. . |
| 4,839,442 | 6/1989 | Craig, Jr. . |
| 4,847,233 | 7/1989 | Shimp . |
| 4,861,823 | 8/1989 | Qureshi . |
| 4,902,752 | 2/1990 | Shimp . |
| 4,918,157 | 4/1990 | Gardner et al. ............... 528/422 |
| 4,931,545 | 6/1990 | Shimp et al. . |
| 4,940,848 | 7/1990 | Shimp . |
| 4,983,683 | 1/1991 | Shimp . |
| 4,999,699 | 3/1991 | Christie . |
| 5,002,818 | 3/1991 | Licari et al. . |
| 5,036,646 | 8/1991 | Makihara et al. ............... 53/432 |
| 5,037,691 | 8/1991 | Medney et al. . |
| 5,056,296 | 10/1991 | Ross et al. ............... 53/329.2 X |
| 5,068,309 | 11/1991 | Shimp . |

(List continued on next page.)

FOREIGN PATENT DOCUMENTS

| | | |
|---|---|---|
| 153338 | 9/1983 | Japan . |
| 2285968 | 12/1987 | Japan . |
| 069883 | 3/1988 | Japan . |

OTHER PUBLICATIONS

D. A. Shimp and W. M. Craig, Jr., "New Liquid Dicyanate Monomer for Rapid Impregnation of Reinforcing Fibers," 34th Int'l SAMPE Symposium, 1989.

Hi-Tek Polymers, "AroCy Cyanate Ester Safety and Handling Bulletin, AroCy Safety and Handling".

(List continued on next page.)

*Primary Examiner*—Horace M. Culver

[57] ABSTRACT

Described is a method of reducing the moisture content in a hermetic package containing a semiconductor device by including a small amount of cyanate ester within the package.

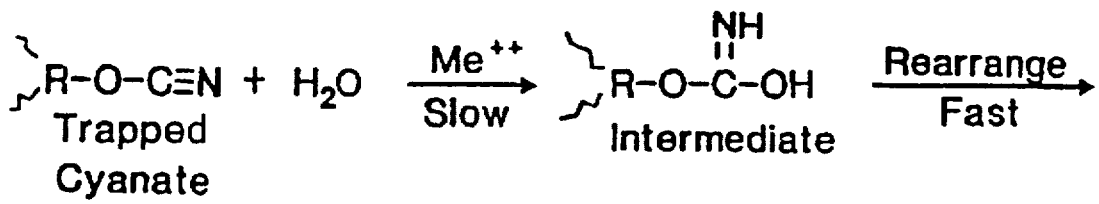

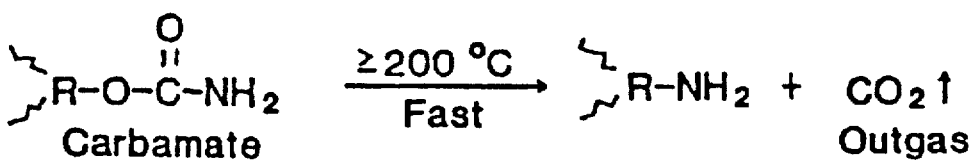

U.S. PATENT DOCUMENTS

| | | | |
|---|---|---|---|
| 5,114,003 | 5/1992 | Jackisch et al. | |
| 5,143,785 | 9/1992 | Pujo et al. | 252/514 |
| 5,149,863 | 9/1992 | Shimp et al. | |
| 5,150,195 | 9/1992 | Nguyen | |
| 5,155,066 | 10/1992 | Nguyen | |
| 5,162,574 | 11/1992 | Craig, Jr. | |
| 5,186,880 | 2/1993 | Gaku et al. | 524/399 |
| 5,195,299 | 3/1993 | Nguyen | 53/428 |
| 5,215,860 | 6/1993 | McCormick et al. | 528/422 |
| 5,250,600 | 10/1993 | Nguyen | |
| 5,261,157 | 11/1993 | Chang | 29/844 |
| 5,325,654 | 7/1994 | Juntunen et al. | 53/440 |

OTHER PUBLICATIONS

Hans Steinegger, "Smart Cards: Bonding Technology at its Limits," Microelectronics Mfg. Tech., Dec. 1992, pp. 13–15.

Andrew Rosenbaum, "Smarter and Smarter," Electronics, Oct. 1991, 32D & 32E.

Daniel Webb, "What Future is in the PC Cards?" Electronic Business, Nov. 4, 1991, p. 11.

"Japan Challenges Intel's Lead in Flash Memories," attached chart World EPROM Market, Semiconductors.

M. Bauer, J. Bauer and G. Kühn, "Kinetics and modelling of thermal polycyclotrimerization of aromatic dicyanates," Acta Polymerica 37 (1986), Nr. 11/12, pp. 715–719.

D. A. Shimp, et al., "AroCy® Cyanate Ester Resin, Chemistry, Properties and Applications," Rhône–Poulenc, Inc.; Jan. 1990, pp. 1–36.

E. Grigat and R. Putter, "New Methods of Preparative Organic Chemistry VI—Synthesis and Reactions of Cyanic Esters," Angew. Chem. Internat. Edit., vol. 6, Nov. 3, 1967, pp. 206–216.

Hi–Tek Polymers, "AroCy® L–10 Cyanate Ester Monomer," Oct. 1989.

Hi–Tek Polymers, "AroCy® Cyanate Ester Resins."Hi–Tek Polymers, "AroCy® F–F40S Cyanate Ester Resin Solution," Apr. 1989.

Hi–Tek Polymers, "AroCy® B–10 Cyanate Ester Monomer," Oct. 1988.

Hi–Tek Polymers, "AroCy® B–40S Cyanate Ester Resin Solution," Oct. 1988.

Hi–Tek Polymers, "AroCy® B–50 Cyanate Ester Hard Resin," Oct. 1988.Hi–Tek Polymers, "AroCy® M–10 Cyanate Ester Monomer," Oct. 1988.

Hi–Tek Polymers, "AroCy® M–30 Cyanate Ester Semisolid Resin," Oct. 1988.

Hi–Tek Polymers, "AroCy® M–40S Cyanate Ester Resin Solution," Oct. 1988.

Hi–Tek Polymers, "AroCy® M–50 Cyanate Ester Hard Resin," Oct. 1988.

Hi–Tek Polymers, "AroCy® T–30 Cyanate Ester Semisolid Resin," Oct. 1988.

Allied Signal Inc., "Primaset—PT Resins, Safety and Handling Bulletin," Mar. 20, 1992.

Allied Signal Inc., "Primaset—PT Resins."

Allied–Signal Inc., "Primaset—PT Resins, Literature List."

Tactic Performance Polymers, "XU–71787.02, XU–71787.07, Developmental Polycyanate Resins for Advanced Composites and Adhesives."

Sajal Das, "Phenol–Triazine (PT) Resin, A New Family of High Performance Thermosets" Cyanate Ester Symposium, Apr. 9–10, 1992. (2)

D. A. Shimp and S. J. Ising, "Moisture Effects and their Control in the Curing of Polycyanate Resins," Cyanate Ester Symposium, Apr. 9–10, 1992. (2)

S. L. Simon and J. K. Gillham, "Cure of a Dicyanate Ester/Polycyanurate System," Cyanate Ester Symposium, Apr. 9–10, 1992. (2)

Fraunhofer Institut fur Angewandte Materialforschung, "Polycyanurates and Their Modifications, State of the Art and New Aspects," Gordon Research Conference on Thermoset, Jun. 1993. (2)

Hi–Tek Polymers, "AroCy® Resins," Dec. 1988. (1)

David Shimp and Mark Southcott, "Controlling Moisture Effects During the Curing of High To Cyanate Ester/Aramid Composites," 38th International Symposium and Exhibition, May 10–13, 1993. (2)

Rhône–Poulenc, "Specialty Resins—Reactive Rubber Tougheners for AroCy® Cyanate Ester Resins," Jan. 1991.

Rhône–Poulenc, "Specialty Resins—Pyrolysis of AroCy® Cyanate Esters."

Rhône–Poulenc, "Specialty Resins—Quantitative Determination of Residual Cyanate in Cured Homopolymers Via FTIR Analysis," Jan. 2, 1992.

Rhône–Poulenc, "Specialty Resins—Compatibility of Cyanate Esters with Aramid Reinforcements and Polyamide/Imide Substrates."

Rhône–Poulenc, "Specialty Resins—AroCy® L–10 Cyanate Ester Monomer," Sep. 1990. (1)

Rhône–Poulenc, "Specialty Resins—AroCy® F–10 Cyanate Ester Monomer," Sep. 1990.

Rhône–Poulenc, "Specialty Resins—AroCy® M–20 Low Melt Viscosity Prepolymer," Sep. 1990.

Rhône–Poulenc, "Specialty Resins—AroCy® B–10 Cyanate Ester Monomer," Oct. 1990.

Rhône–Poulenc, "Specialty Resins—Toxicity of AroCy® Cyanate Esters."

Rhône–Poulenc, "Specialty Resins—AroCy® M–10 Cyanate Ester Monomer," Sep. 1990.

Rhône–Poulenc, "Specialty Resins—AroCy® Cyanate Ester Resins."

Rhône–Poulenc, "Specialty Resins—AroCy® Cyanate Ester Resins" list.

Rhône–Poulenc, "Specialty Resins—AroCy® F–40S Cyanate Ester Resin Solution," Jul. 1990.

Rhône–Poulenc, "Specialty Resins—AroCy® B–30 Cyanate Ester Semisolid Resin."

Rhône–Poulenc, "Specialty Resins—AroCy® B–40S Cyanate Ester Resin Solution," Aug. 1990.

Rhône–Poulenc, "Specialty Resins—AroCy® B–50 Cyanate Ester Hard Resin," Sep. 1990.

Rhône–Poulenc, "Specialty Resins—AroCy® M–40S Cyanate Ester Resin Solution," Aug. 1990.

Rhône–Poulenc, "Specialty Resins—AroCy® M–30 Cyanate Ester Semisolid Resin," Sep. 1990.

Rhône–Poulenc, "Specialty Resins—AroCy® M–50 Cyanate Ester Hard Resin," Sep. 1990.

Rhône–Poulenc, "Specialty Resins—AroCy® Cyanate Ester Safety and Handling Bulletin," Sep. 1990.

Rhône–Poulenc, "Specialty Resins—Formulating AroCy® Cyanate Esters for Resin Transfer Molding Applications," Apr. 1991.

Rhône–Poulenc, "Specialty Resins—AroCy® Cyanate Ester Adhesives for Polyimide Flexible Circuitry," Jan., 1991.

Rhône–Poulenc, "Galvanic Corrosion of Carbon Fiber Composites," Jan. 1991.

Hi–Tek Polymers, "REX–378 Developmental Cyanate Ester Prepolymer."

Uri Sela and Hans Steinegger, "Dispensing Technology—The Key to High-Quality, High-Speed Die Bonding," *Microelectronics Manufacturing Technology*, Feb. 1991, pp. 47–52.

Jack R. Christenson and David A. Shimp, "Improvements in Performance and Processing Using cyanate Ester Blends and Alloys," Ultralloy '90, pp. 191–208. (1)

Tony del Rosario, "JM 7000 Low Temperature Die Attach Material Qualification Report," Olin Interconnect Technologies, Dec. 10, 1992. (2)

Malcolm L. White, et al., "Attaining Low Moisture Levels in Hermetic Packages," *IEEE/Proc. IRPS*, 1982, pp. 253–259. (1)

David P. Galloway and My N. Nguyen, "A New, Reliable Snap Cure Die Attach Adhesive," *Mat. Res. Soc. Symp. Proc.*, vol. 264, 1992, pp. 271–280.

Sue Oliver, et al., "Silver/Polymer Die Attach for Ceramic Package Assembly," 1992 IEPS meeting, Sep. 27–30, 1992. (2)

My N. Nguyen and Michael B. Grosse, "Low Moisture Polymer Adhesive for Hermetic Packages," *IEEE Trans. on Components, Hybrids, and Manufacturing Technology*, vol. 15, No. 6, Dec. 1992, pp. 964–971. (2)

Richard H. Estes, "A Practical Approach to Die Attach Adhesive Selection," *Hybrid Circuit Technology*, Jun. 1991.

Tom Ramsey and Gail Heinen, "Controlling Moisture in Ceramic Packages," *Semiconductor International*, Aug. 1988.

Mitsubishi Gas Chemical Company, Inc., "High Heat Resistant BT Resin— Bismaleimide–Triazine Resin," Fourth Edition, Sep. 1, 1984.

Sue Oliver, "Qualification Status and Extended Stressing of JM7000 Silver/Polymer Die Attach Adhesive for Ceramic Package Assembly," Jan. 12, 1993. (2)

Hi-Tek Polymers, "AroCy® F–10 Cyanate Ester Monomer," Apr. 1989.

Hi-Tek Polymers, "AroCy® B–30 Cyanate Ester Semisolid Resin," Oct. 1988.

*AroCy Cyanate Ester Resins*, D. A. Shimp, Jr., et al., Rhone–Poulenc, Jan., 1990, pp. 1–36.

*New Methods of Preparative Organic Chemistry VI—Synthesis and Reactions of Cyanate Esters*, E. Grigat & R. Putter, Angew. Chem. International Edition, vol. 6 (1967), No. 3, pp. 206–216.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–3 is confirmed.

New claim 4 is added and determined to be patentable.

*4. A method of reducing the water moisture content in a hermetic package containing a semiconductor device to less than 100 ppm comprising incorporating within said package a small but effective amount of cyanate ester, reacting said cyanate ester with water to produce an imidocarbonic acid which molecularly rearranges upon formation into a stable carbamate molecular structure, and exposing said package to an elevated temperature in the range of about 100° C. to 400° C. whereby said carbamate further reacts with water to produce carbon dioxide.*

* * * * *